(12) United States Patent
Hara

(10) Patent No.: US 7,365,657 B2
(45) Date of Patent: Apr. 29, 2008

(54) DATA IDENTIFICATION METHOD AND APPARATUS

(75) Inventor: Masaaki Hara, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/644,473

(22) Filed: Dec. 22, 2006

(65) Prior Publication Data

US 2007/0159364 A1    Jul. 12, 2007

(30) Foreign Application Priority Data

Jan. 12, 2006    (JP) .............................. 2006-005116

(51) Int. Cl.
*H03M 5/00* (2006.01)
(52) U.S. Cl. ........................... 341/58; 341/59; 341/106
(58) Field of Classification Search ................ 341/58
See application file for complete search history.

(56) References Cited

U.S. PATENT DOCUMENTS 6,346,897 B1 *  2/2002  Roh et al. ................... 341/106
6,661,725 B2 * 12/2003  Roh .............................. 365/216
6,895,114 B2 *  5/2005  Hwang ........................ 382/173

OTHER PUBLICATIONS

B.M.King and M.A. Neifield; "Low-complexity maximum-likelihood decoding of shortened enumerative permutation codes for holographic storage"; Apr. 2001 IEEE Journal vol. 19; No. 4 pp. 783-790.
B.M. King and M.A. Neifield; "Sparse modulation coding for increased capacity in volume holographic storage"; Dec. 2000; Applied Optics; vol. 39; pp. 6681-6688.
Holography Boosting to Realize Tera-Byte Disk; Detailed Report on "International Symposium on Optical Memory" ISOM/ODS'05; Nikkei Electronics; Aug. 15, 2005; No. 906; pp. 51-58; with an English Translation thereof.

* cited by examiner

*Primary Examiner*—Khai M. Nguyen
(74) *Attorney, Agent, or Firm*—Robert J. Depke; Rockey, Depke & Lyons, LLC.

(57) ABSTRACT

A data identification method including: a first step; a second step; a third step; and a fourth step, and the third and fourth steps being repeated until an identification result included in the table of recording modulation codes is obtained at the third step.

10 Claims, 18 Drawing Sheets

FIG. 3C

TOTAL BIT NUMBER: 192 BITS × 192BITS

1 SYMBOL: 4 BITS × 4BITS
SUB PAGE: 6 SYMBOLS × 6 SYMBOLS
(AMONG THEM, 6 SYMBOLS REPRESENT SYNC)
1 PAGE: 52 SUB PAGES
(AMONG THEM, 1 SUB PAGE IS PAGE SYNC)

THE EFFECTIVE SYMBOL NUMBER OF 1 PAGE IS
$(52-1) \times (6 \times 6 - 4) = 1632$ SYMBOLS WHERE SYMBOLS IN ONE PAGE ARE
REPRESENTED AS symbol $(i, j)$,
$i$: VERTICAL DIRECTION AND
$j$: HORIZONTAL DIRECTION, AND
symbol (1, 4:6)
symbol (2, 2:7)
symbol (3:6, 1:8)
symbol (7, 2:7)
symbol (8, 3:6)
INCLUDE USER DATA.

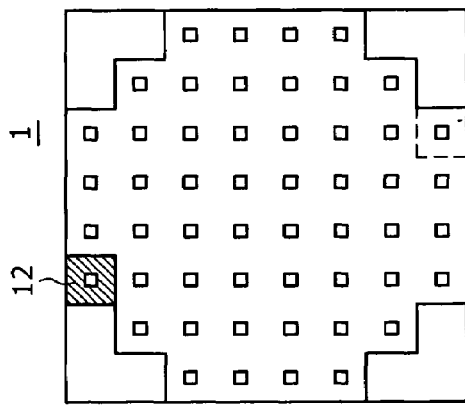

FIG. 3A

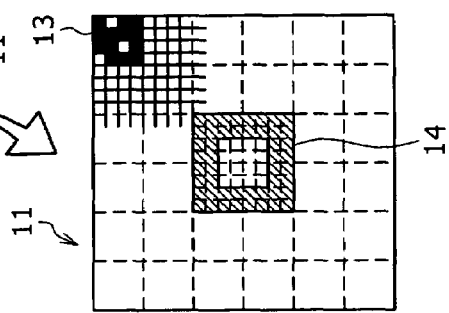

(LEGEND)
180## ← DECIMAL NOTATION OF 8 BITS
0 0 1 0      ← 4 × 4 SYMBOLS
0 0 0 1
0 0 0 0
0 0 1 0

FIG. 5

| ##40## 1 0 0 0 | ##41## 1 0 0 0 | ##42## 0 0 0 0 | ##43## 0 0 0 0 | ##44## 1 0 0 0 | ##45## 0 0 0 0 | ##46## 0 0 0 0 | ##47## 1 0 0 0 |
|---|---|---|---|---|---|---|---|
| 0 0 1 0 | 0 0 1 0 | 1 0 0 1 0 | 0 1 0 0 1 0 | 0 0 0 1 0 | 0 0 1 0 | 0 1 0 0 1 0 | 0 0 1 0 |
| 0 0 0 0 | 1 0 0 0 | 0 1 0 0 0 | 0 0 0 0 | 0 0 0 0 | 1 0 1 0 0 | 0 1 0 0 | 0 1 0 1 0 |
| 1 0 0 0 | 0 0 0 0 | 0 1 0 0 | 0 1 0 0 | 0 1 0 0 | 1 0 0 0 | 0 0 0 0 | 0 0 0 0 |

(LEGEND)
180##  ← DECIMAL NOTATION OF 8 BITS
0 0 1 0
0 0 0 1  ← 4 × 4 SYMBOLS
0 0 0 0
0 0 1 0

(Table data approximate — figure shows 40 through 79 blocks of 4×4 binary symbol matrices)

FIG. 6

| ##80## | 00110 | ##81## | 10110 | ##82## | 00110 | ##83## | 00110 | ##84## | 10000 | ##85## | 10000 | ##86## | 10000 | ##87## | 10000 |

(table too complex — reproducing as figure)

(LEGEND)
180## ← DECIMAL NOTATION OF 8 BITS
0010
0001  ← 4 × 4 SYMBOLS
0000
0010

FIG. 7

| | | | | | | | |
|---|---|---|---|---|---|---|---|
| ##120## 0010 0000 0000 0101 | ##121## 0010 0010 0100 0001 | ##122## 0010 0101 0000 0001 | ##123## 0010 0000 0010 0001 | ##124## 0000 1010 1000 0001 | ##125## 1000 1000 1000 0001 | ##126## 1000 1000 1000 0001 | ##127## 0000 1000 0100 0001 |
| ##128## 0000 0100 0010 0100 | ##129## 1000 0000 0000 0101 | ##130## 0000 1010 1000 0001 | ##131## 0001 0100 0000 0001 | ##132## 1000 0101 0000 0100 | ##133## 0000 0100 1000 0001 | ##134## 0000 0100 0000 0001 | ##135## 1000 0100 0001 0001 |
| ##136## 0000 0100 0000 0100 | ##137## 0100 0000 1000 0000 | ##138## 0100 1000 0000 0001 | ##139## 0100 1000 0000 0010 | ##140## 0100 0000 0000 0100 | ##141## 0100 0100 0100 0001 | ##142## 0000 0000 1001 1010 | ##143## 0000 0000 0110 0000 |
| ##144## 0000 1000 0000 0010 | ##145## 1000 0000 0010 0010 | ##146## 0000 0010 0010 0010 | ##147## 0000 0010 0100 0100 | ##148## 0100 0000 0001 0001 | ##149## 0000 0000 1000 0001 | ##150## 0000 0010 1001 0010 | ##151## 0000 0010 0000 0010 |
| ##152## 1000 0000 0010 0010 | ##153## 0000 0000 0010 0101 | ##154## 0000 0000 1010 0100 | ##155## 0010 0010 0100 0001 | ##156## 0000 0000 0010 0001 | ##157## 0010 0000 1000 0001 | ##158## 0010 1000 0000 0001 | ##160## 0010 0010 0001 0001 |

(LEGEND)
180## 0010 ← DECIMAL NOTATION OF 8 BITS
0001
0000 ← 4 × 4 SYMBOLS
0010

FIG. 8

| ##160## | ##161## | ##162## | ##163## | ##164## | ##165## | ##166## | ##167## |
|---|---|---|---|---|---|---|---|
| 1 0 1 0 | 0 0 1 0 | 0 0 1 0 | 0 0 1 0 | 0 0 1 0 | 1 0 0 0 | 1 0 0 0 | 1 0 0 1 |
| 0 0 0 0 | 0 0 0 0 | 0 0 0 0 | 0 1 0 0 | 0 0 0 0 | 0 0 0 1 | 0 0 0 1 | 0 1 0 0 |
| 0 0 0 1 | 0 0 0 1 | 0 1 0 1 | 0 0 0 1 | 0 0 1 0 | 0 0 0 0 | 0 0 0 0 | 0 0 0 0 |
| 0 0 0 0 | 0 1 0 0 | 0 0 0 0 | 0 0 0 1 | 0 0 0 0 | 0 0 0 1 | 0 0 0 0 | 0 0 1 0 |

| ##168## | ##169## | ##170## | ##171## | ##172## | ##173## | ##174## | ##175## |
|---|---|---|---|---|---|---|---|
| 0 0 0 0 | 0 0 0 0 | 1 0 0 0 | 0 0 0 0 | 0 0 0 0 | 1 0 0 0 | 0 0 0 0 | 0 0 0 0 |
| 0 1 0 0 | 0 1 0 1 | 0 0 0 0 | 1 0 1 0 | 0 1 0 0 | 0 1 0 0 | 1 0 0 0 | 1 0 1 0 |
| 0 1 0 0 | 0 0 0 0 | 0 1 0 0 | 1 0 0 0 | 0 0 1 0 | 0 0 0 0 | 1 0 0 0 | 0 0 0 0 |
| 0 1 0 0 | 0 1 0 0 | 0 1 0 0 | 0 0 0 0 | 0 0 0 0 | 0 0 0 1 | 0 0 0 0 | 0 0 0 0 |

| ##176## | ##177## | ##178## | ##179## | ##180## | ##181## | ##182## | ##183## |
|---|---|---|---|---|---|---|---|
| 1 0 1 0 | 0 0 0 0 | 0 1 0 0 | 0 1 0 0 | 0 0 1 0 | 0 1 0 0 | 0 1 0 0 | 0 0 0 0 |
| 0 1 0 1 | 0 1 0 1 | 0 0 0 0 | 0 0 0 1 | 0 0 0 1 | 0 0 0 0 | 0 0 0 0 | 1 0 0 0 |
| 0 0 0 0 | 0 0 0 0 | 1 0 0 0 | 1 0 0 0 | 0 0 0 0 | 0 0 0 1 | 0 1 0 0 | 1 0 1 0 |
| 0 0 0 0 | 0 1 0 0 | 1 0 0 0 | 0 0 0 0 | 0 0 1 0 | 0 0 0 0 | 0 0 0 1 | 0 0 0 0 |

| ##184## | ##185## | ##186## | ##187## | ##188## | ##189## | ##190## | ##191## |
|---|---|---|---|---|---|---|---|
| 0 0 0 0 | 0 0 0 0 | 1 0 0 0 | 0 0 0 0 | 0 0 0 0 | 0 0 0 0 | 0 0 0 0 | 0 0 0 0 |
| 1 0 0 1 | 0 1 0 0 | 0 0 0 0 | 0 1 0 0 | 0 1 0 0 | 0 0 0 0 | 1 0 0 0 | 0 1 0 1 |
| 1 0 0 1 | 0 0 0 1 | 0 0 0 0 | 0 1 0 1 | 0 0 1 0 | 0 0 0 1 | 0 0 1 0 | 0 0 0 0 |
| 0 0 1 0 | 0 0 1 0 | 0 0 1 0 | 0 1 0 0 | 0 0 1 0 | 0 0 1 0 | 0 0 0 0 | 0 0 0 0 |

| ##192## | ##193## | ##194## | ##195## | ##196## | ##197## | ##198## | ##199## |
|---|---|---|---|---|---|---|---|
| 0 0 0 0 | 1 0 0 0 | 0 0 0 0 | 0 0 0 0 | 0 1 0 0 | 0 0 0 1 | 0 0 1 0 | 0 0 1 0 |
| 0 0 1 0 | 0 0 0 1 | 0 0 0 1 | 0 1 0 1 | 0 0 0 0 | 1 0 0 0 | 0 1 0 0 | 0 0 0 1 |
| 0 0 1 0 | 0 0 0 1 | 0 0 1 0 | 0 0 1 0 | 0 0 1 0 | 0 0 0 1 | 0 0 0 1 | 0 0 0 0 |
| 0 0 0 0 | 0 0 0 0 | 0 1 0 0 | 0 0 0 0 | 0 0 0 0 | 0 0 1 0 | 0 0 0 0 | 0 0 1 0 |

(LEGEND)

180## ← DECIMAL NOTATION OF 8 BITS
0 0 1 0
0 0 0 1   ← 4 x 4 SYMBOLS
0 0 0 0
0 0 1 0

FIG. 9

| ## 200 ## | ## 201 ## | ## 202 ## | ## 203 ## | ## 204 ## | ## 205 ## | ## 206 ## | ## 207 ## |
|---|---|---|---|---|---|---|---|
| 1 0 1 0 | 0 0 1 0 | 0 0 1 0 | 0 0 1 0 | 0 0 1 0 | 0 0 1 0 | 0 0 0 0 | 0 0 0 0 |
| 0 0 0 1 | 0 0 0 1 | 0 0 0 1 | 0 1 0 1 | 0 0 0 1 | 0 0 1 0 | 0 0 0 1 | 1 0 0 1 |
| 0 0 0 0 | 0 0 0 0 | 0 1 0 0 | 0 0 0 0 | 0 0 0 0 | 0 0 1 0 | 0 0 0 1 | 0 0 0 1 |
| 0 0 0 0 | 0 1 0 0 | 0 0 0 0 | 0 0 0 0 | 0 1 1 0 | 0 0 0 0 | 1 0 0 1 | 0 0 1 1 |

| ## 208 ## | ## 209 ## | ## 210 ## | ## 211 ## | ## 212 ## | ## 213 ## | ## 214 ## | ## 215 ## |
|---|---|---|---|---|---|---|---|
| 0 0 0 0 | 1 0 0 0 | 0 0 0 0 | 0 0 0 0 | 0 0 0 0 | 0 1 0 0 | 0 0 0 0 | 0 0 1 0 |
| 1 0 0 0 | 0 0 0 1 | 0 0 0 1 | 0 0 0 1 | 0 1 0 1 | 0 0 0 1 | 0 0 0 1 | 0 0 0 1 |
| 0 0 0 0 | 0 0 0 0 | 0 0 0 0 | 0 1 0 0 | 0 0 0 0 | 0 0 0 0 | 0 0 1 0 | 0 0 0 0 |
| 0 0 0 1 | 0 0 0 1 | 0 1 0 1 | 0 0 0 1 | 0 0 0 1 | 0 0 0 1 | 0 0 0 1 | 0 0 1 1 |

| ## 216 ## | ## 217 ## | ## 218 ## | ## 219 ## | ## 220 ## | ## 221 ## | ## 222 ## | ## 223 ## |
|---|---|---|---|---|---|---|---|
| 0 0 0 1 | 1 0 0 1 | 0 0 0 0 | 0 0 0 1 | 0 0 0 1 | 1 0 0 1 | 0 0 0 1 | 0 0 0 1 |
| 0 1 0 0 | 0 0 0 0 | 0 0 0 0 | 1 0 0 0 | 0 0 0 0 | 0 0 0 0 | 0 0 0 0 | 0 1 0 0 |
| 0 0 0 0 | 0 0 0 0 | 0 1 0 0 | 0 1 0 0 | 0 0 0 0 | 0 1 0 0 | 1 0 0 0 | 0 0 0 0 |
| 1 0 0 0 | 1 0 0 0 | 0 0 0 0 | 0 1 0 0 | 0 1 0 0 | 0 1 0 0 | 0 0 0 0 | 0 0 0 1 |

| ## 224 ## | ## 225 ## | ## 226 ## | ## 227 ## | ## 228 ## | ## 229 ## | ## 230 ## | ## 231 ## |
|---|---|---|---|---|---|---|---|
| 1 0 0 1 | 0 0 0 1 | 0 0 0 1 | 0 0 0 1 | 0 0 0 1 | 0 1 0 1 | 1 0 0 1 | 0 1 0 1 |
| 0 0 0 0 | 0 1 0 0 | 0 1 0 1 | 0 1 0 0 | 0 1 0 0 | 0 0 0 0 | 0 0 0 0 | 0 0 0 0 |
| 0 1 0 0 | 0 0 0 0 | 0 0 0 0 | 0 0 0 0 | 0 0 0 0 | 0 0 0 0 | 0 0 0 0 | 0 0 0 0 |
| 1 0 0 0 | 1 0 0 0 | 0 0 0 0 | 0 0 0 0 | 0 0 0 0 | 1 0 0 0 | 0 0 0 0 | 1 0 0 1 |

| ## 232 ## | ## 233 ## | ## 234 ## | ## 235 ## | ## 236 ## | ## 237 ## | ## 238 ## | ## 239 ## |
|---|---|---|---|---|---|---|---|
| 0 1 0 1 | 0 1 0 1 | 0 0 0 1 | 0 0 0 1 | 0 1 0 1 | 0 1 0 1 | 0 0 0 1 | 0 0 0 1 |
| 0 0 0 0 | 0 0 0 0 | 0 0 0 0 | 0 0 0 0 | 0 0 0 0 | 0 0 0 0 | 0 0 0 1 | 0 1 0 1 |
| 0 0 0 0 | 0 1 0 0 | 0 0 0 0 | 0 0 0 0 | 0 0 0 1 | 0 0 0 0 | 0 1 0 0 | 0 0 0 0 |
| 0 1 0 0 | 0 0 0 0 | 0 1 1 0 | 0 1 1 0 | 0 0 0 1 | 0 0 1 0 | 0 1 1 0 | 1 0 0 0 |

(LEGEND)

180 ## ← DECIMAL NOTATION OF 8 BITS
0 0 1 0
0 0 0 1          ← 4 × 4 SYMBOLS
0 0 0 0
0 0 1 0

248##  0 0 0 1    ##249##  0 0 0 1    ##250##  0 0 0 1    ##251##  1 0 0 1    ##252##  0 0 0 1    ##253##  0 0 0 1    ##254##  0 1 0 1    ##255##  0 0 0 1
         0 0 1 0             1 0 1 0             0 1 0 1             0 0 1 0             0 0 0 0             0 1 0 0             0 0 1 0             0 0 0 0
         0 0 0 0             0 0 0 0             0 0 0 0             0 0 0 0             0 1 0 0             0 0 0 0             0 0 0 0             0 0 1 0
         1 0 0 0             0 0 0 0             0 0 0 0             0 0 0 0             0 0 0 0             0 0 0 1             0 0 0 0             0 1 0 0
```
-------- UNUSED
```
##256##  0 0 0 1    ##257##  0 0 0 1    ##258##  0 0 0 1    ##259##  1 0 0 1    ##260##  0 0 0 1    ##261##  0 0 0 1    ##262##  0 0 0 1    ##263##  0 1 0 1
         0 0 0 0             1 0 0 0             0 1 0 0             0 0 0 0             0 0 0 0             0 1 0 0             0 0 0 0             0 0 0 0
         1 0 0 0             0 0 0 0             0 0 0 0             0 0 0 0             1 0 1 0             0 0 0 0             0 0 1 0             0 0 0 0
         0 0 1 1             0 0 0 1             0 0 0 1             0 0 0 1             0 0 0 0             0 0 0 1             0 1 0 1             1 0 0 1

##264##  0 0 0 1    ##265##  0 0 0 1    ##266##  0 0 0 1    ##267##  1 0 0 1    ##268##  0 0 0 1    ##269##  1 0 0 1    ##270##  0 0 0 1    ##271##  0 0 0 1
         0 0 0 0             0 0 0 0             1 0 0 0             0 1 0 0             0 0 0 0             0 0 0 0             0 0 0 0             0 0 1 0
         0 0 1 0             0 0 0 0             0 0 0 0             0 0 1 0             0 1 0 0             0 0 0 0             1 0 0 0             0 0 0 0
         0 0 0 1             0 0 0 1             1 0 0 1             0 1 0 1             0 0 1 0             0 0 1 0             0 0 1 0             0 1 0 1

##272##  0 0 0 1    ##273##  0 1 0 1    ##274##  0 0 0 1    ##275##  0 0 0 0
         0 0 0 0             0 0 0 0             0 0 0 0             0 0 0 1
         0 1 0 0             0 0 0 0             0 1 0 0             0 0 1 0
         0 0 1 0             0 1 0 1             0 1 0 1             0 1 0 1
```

0~255 USED, 256~275 UNUSED (LEGEND)

```
##180##  0 0 1 0   ← DECIMAL NOTATION OF 8 BITS
         0 0 0 1   ← 4×4 SYMBOLS
         0 0 0 0
         0 0 1 0
```

AFTER RE-SAMPLING

AFTER 2 X 2 OVERSAMPLING

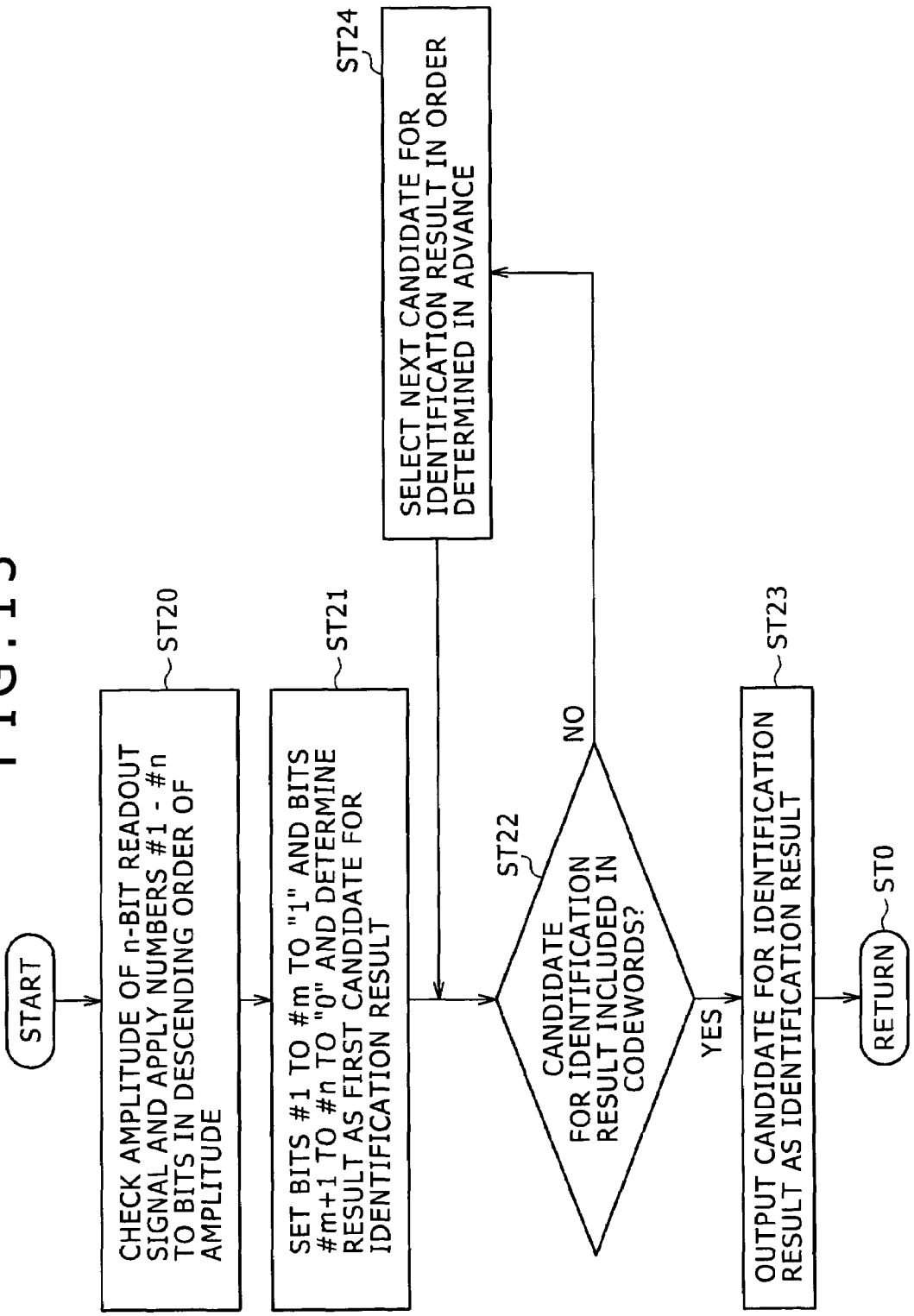

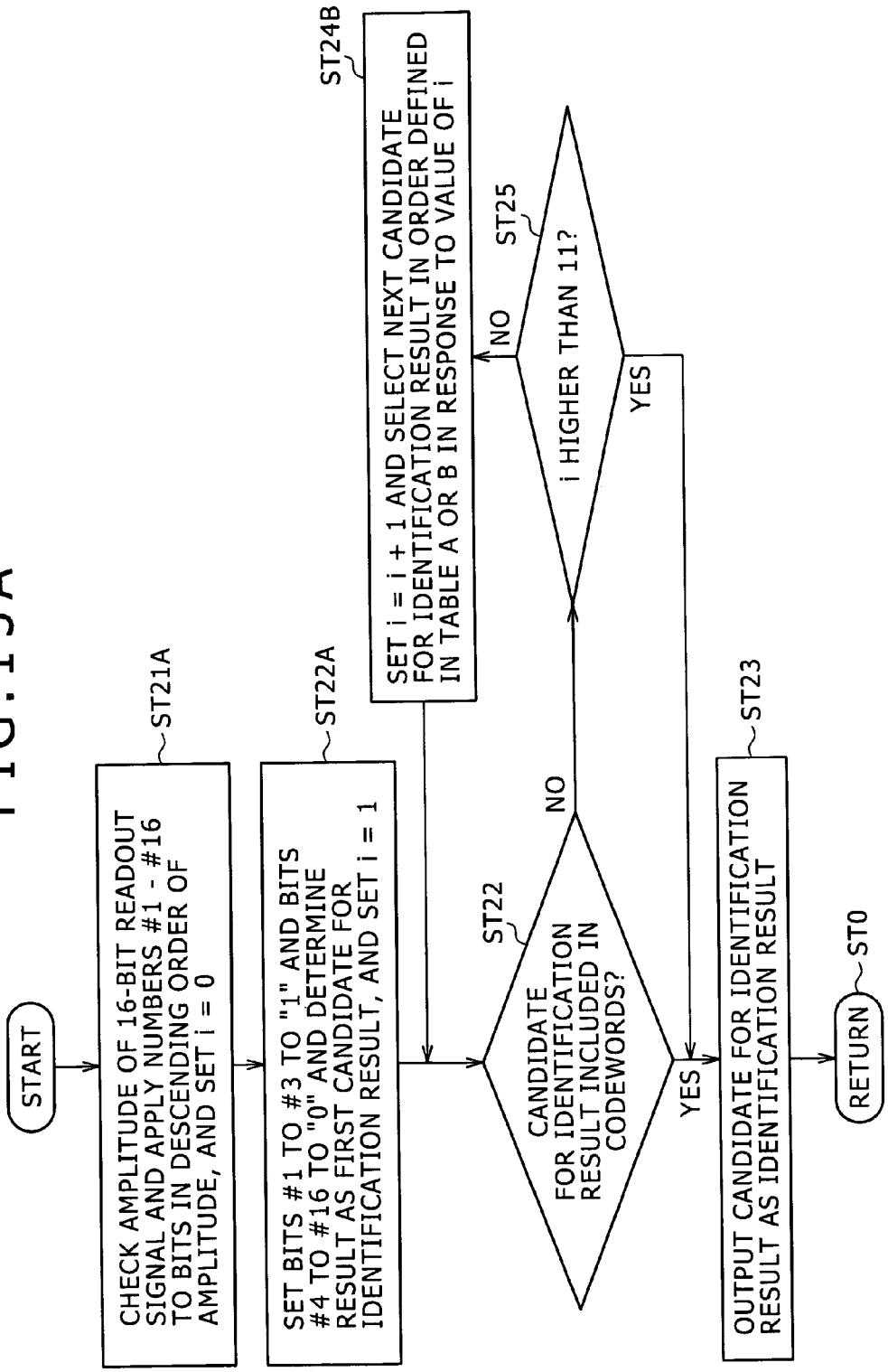

FIG. 15B

| i | NUMBERS TO BE SET TO 1 | | | SUM |
|---|---|---|---|---|
| 1 | #1 | #2 | #3 | 6 |
| 2 | #1 | #2 | #4 | 7 |
| 3 | #1 | #2 | #5 | 8 |
| 4 | #1 | #2 | #4 | 8 |
| 5 | #1 | #3 | #6 | 9 |
| 6 | #1 | #2 | #5 | 9 |
| 7 | #2 | #3 | #4 | 9 |
| 8 | #1 | #3 | #7 | 10 |
| 9 | #1 | #3 | #6 | 10 |
| 10 | #1 | #4 | #5 | 10 |
| 11 | #2 | #3 | #5 | 10 |

FIG. 15C

| i | NUMBERS TO BE SET TO 1 | | | SUM |
|---|---|---|---|---|
| 1 | #1 | #2 | #3 | 6 |
| 2 | #1 | #2 | #4 | 7 |
| 3 | #1 | #3 | #4 | 8 |
| 4 | #2 | #2 | #5 | 8 |
| 5 | #1 | #3 | #4 | 9 |
| 6 | #1 | #3 | #5 | 9 |
| 7 | #2 | #2 | #6 | 9 |
| 8 | #1 | #3 | #5 | 10 |
| 9 | #1 | #4 | #5 | 10 |
| 10 | #1 | #3 | #6 | 10 |
| 11 | #1 | #2 | #7 | 10 |

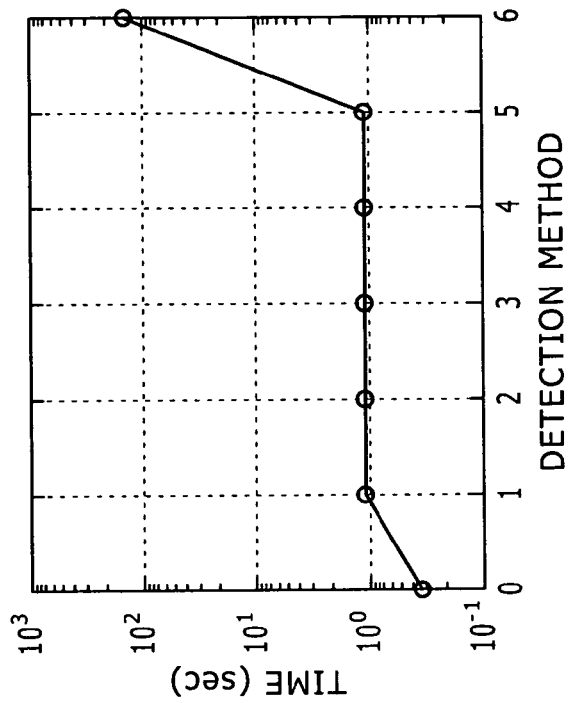
FIG.16A
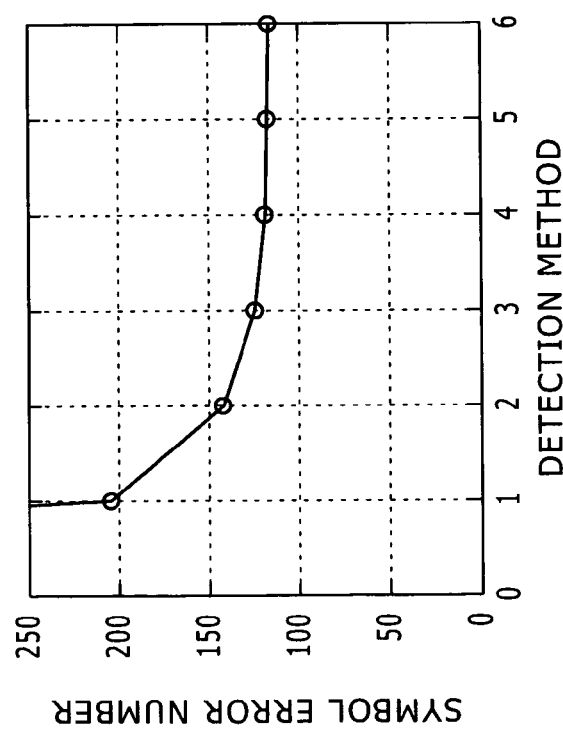
FIG.16B
| DETECTION METHOD | THRESHOLD VALUE DETECTION | SORT DETECTION | RETRY DETECTION | | | | CORRELATION DETECTION |
|---|---|---|---|---|---|---|---|
| | | | 2 (#1-#4) | 3 (#1-#5) | 4 (#1-#6) | 5 (#1-#7) | |
| X (SELECTION OBJECT) | 0 (#1-#16) | 1 (#1-#3) | 207 | 143 | 125 | 120 | 119 | 6 (#1-#16) |
| ERROR NUMBER | 1316 | 207 | 143 | 125 | 120 | 119 | 118 |
| CALCULATION TIME (sec) | 0.34375 | 1.0781 | 1.1094 | 1.0781 | 1.0469 | 1.1094 | 144.06 |
FIG.16C

DATA IDENTIFICATION METHOD AND APPARATUS

CROSS REFERENCES TO RELATED APPLICATIONS

The present invention contains subject matter related to Japanese Patent Application JP 2006-005116 filed with the Japanese Patent Office on Jan. 12, 2006, the entire contents of which being incorporated herein by reference.

BACKGROUND OF THE INVENTION

1. Field of the Invention

This invention relates to a data identification method and apparatus which identifies, from within a readout signal from a recording medium on or in which user data are recorded using a recording modulation code called sparse code, the data.

2. Description of the Related Art

Recently, research and development of an information processing apparatus which makes use of the principle of hologram recording are carried out actively as disclosed, for example, in "Holographic encouraged for implementation of a terabyte disk", *Nikkei Electronics*, Aug. 15, 2005, No. 906, pp. 51-58 (hereinafter referred to as Non-Patent Document 1).

It is already known that, where hologram recording is used, there is the possibility that a much higher recording density than those of existing optical disks may be achieved. It makes a background of the recent active research and development that peripheral techniques have been and are being prepared such as appearance of light sources such as a semiconductor laser and hologram recording media formed using photopolymer.

As a recording modulation code for hologram recording, a recording modulation code called sparse code wherein m bits from among n bits which form one symbol represent "1" while the remaining n-m bits represent "0" is used favorably. The sparse code is disclosed, for example, in B. M. King and M. A. Neifield, "Sparse modulation coding for increased capacity in volume holographic storage", APPLIED OPTICS, Vol. 39, pp. 6681-6688, December, 2000 (hereinafter referred to as Non-Patent Document 2).

In the following, the sparse code is described particularly based on quotations from Non-Patent Document 2.

Where the M number which is an index to the overwriting performance of a hologram recording medium is represented by "M#" and the multiplexing number by which the user can actually perform overwriting is represented by "M", the diffraction efficiency ηpage in a unit of a page is given by the following expression (1):

$$\eta page = (M\#/M)^2 \quad (1)$$

If the ratio of "1s" in a recording modulation code is defined as a sparse rate $\pi 1$, then in the case of a hologram wherein the number of pixels on one page is "N", the diffraction efficiency ηpixel in a unit of a pixel is represented by the following expression (2):

$$\eta pixel = (M\#/M)^2 / (\pi 1 \cdot N) \quad (2)$$

Accordingly, the diffraction efficiency which one pixel can obtain increases as the sparse rate $\pi 1$ of the recording modulation code decreases.

If it is assumed that noise is fixed irrespective of the multiplexing number, then the number M* of pages which can be multiplexed with a fixed diffraction efficiency η* is given by the following expression (3):

$$M^* \propto M\# / \sqrt{(\pi 1 \cdot N)} \quad (3)$$

Meanwhile, the information entropy $I(\pi 1)$ of an ideal encoder whose sparse rate is $\pi 1$ is given, where a sparse rate $\pi 0$ indicative of the ratio of "0s" of the recording modulation code is used, by the following expression (4-1). Further, the user capacity C by the ideal encoder can be calculated using the following expression (4-2):

$$I(\pi 1) = -\pi 1 \cdot \log_2(\pi 1) - \pi 0 \cdot \log_2(\pi 1) \quad (4-1)$$

[where $\pi 0 = 1 - \pi 1$]

$$C = I(\pi 1) \cdot M^* \quad (4-2)$$

Although the information entropy is a term difficult to understand, this is equivalent to an encoding rate r=k/n of the recording modulation code where user data of k bits are converted into codewords (symbols) of n bits. The information entropy of the ideal encoder corresponds to the encoding rate where n is infinite.

FIG. 17 illustrates a result of calculation of the user capacity C where the sparse rate $\pi 1$ is varied from 0 to 1.

Since the M number M# may have any particular number, the user capacity is normalized such that it is 1 where the sparse rate $\pi 1$ is $\pi 1=0.5$ (the numbers of "1s" and "0s" are equal to each other) with which the information entropy $I(\pi 1)$ is 1.

From this result, it can be recognized that, in hologram recording, the optimum value of the sparse rate $\pi 1$ is approximately $\pi 1=0.25$ and the user capacity exhibits an increase by approximately 15% when compared with an alternative case wherein the sparse rate $\pi 1$ is $\pi 1=0.5$ where the numbers of "1s" and "0s" are equal to each other.

In an actual recording modulation code, if the bit number n of a codeword is increased, then encoding and decoding become difficult. Therefore, the bit number of a codeword assumes a limited value, and the coding efficient becomes lower than that of the ideal encoder. the sparse code which can be implemented can be defined, using the bit number n of one symbol, the number m of bits of "1" in one symbol and the bit number k of the user, by E(n,m,k). Here, the "symbol" is a minimum unit of a holographic reproduction image composed of, for example, 4×4 pixels, and one symbol corresponds to one codeword (sparse code).

Non-Patent Document 2 discloses a working example wherein a page (sparse page) which is a set of sparse codes is coded in E(52,13,39).

The simplest one of data detection methods is "threshold value detection" wherein a readout signal is identified as "1" if the bit amplitude of the readout signal is greater than a threshold value determined in advance but is identified as "0" if the bit amplitude is smaller than the threshold value. On the other hand, in hologram recording in which the sparse code is used, bit detection methods called "sort detection" and "correlation detection" are used favorably.

In hologram recording, since the variation of the bit amplitude in a page is so great that it is difficult to determine a threshold value for threshold value detection, if the threshold value detection is used, then a very great number of errors appear.

The sort detection is carried out in the following procedure.

First, for example, where the sparse code is E(16,3,8), the bit amplitude of 16-bit codewords (one-symbol codes) which form a readout signal is checked and the numbers #1 to #16 are applied to the bits of the codewords in the descending order of the amplitude.

Then, an identification result is determined such that the codeword bits of the numbers #1 to #3 are set to "1" while the remaining codeword bits of the numbers #4 to #16 are set to "0".

If it is assumed that the readout signal is in an AD (Analog-to-Digital) converted form in 8 bits (0 to 255), then the correlation detection is performed in the following procedure.

Where the readout signal is in an AD-converted form in 8 bits, since it assumes a value within the range from 0 to 255, it is appropriate to set the value 193 which is ¾ of the distribution of such values as a target value for "1" while the value 64 which is ¼ of the distribution is set as a target value for "0". Then, for 256 different codewords which may possibly be recorded, at each bit of "1", the square of the amplitude difference between the target value 191 and the readout signal is calculated, but at each bit of "0", the square of the amplitude difference between the target value 64 and the readout signal is calculated. Then, the sum of the square errors for 16 bits is calculated to obtain an evaluation value of the likelihood by which each codeword is recorded.

Then, the evaluation values are compared with each other, and that one of the evaluation values which exhibits the highest likelihood is determined as an identification result.

A related method is disclosed also in B. M. King and M. A. Neifield, "Low-complexity maximum-likelihood decoding of shortened enumerative permutation codes for holographic storage", IEEE JOURNAL ON SELECTED AREAS IN COMMUNICATION, Vol. 19, No. 4, pp. 783-790, April, 2001 (hereinafter referred to as Non-Patent Document 3).

SUMMARY OF THE INVENTION

When compared with the threshold value detection, the sort detection and the correlation detection have a significant merit that they are not influenced by the amplitude variation.

Although the sort detection can be implemented simply by a circuit because it only involves comparison and sorting of 16 different values, since those 3 bits of a 16-bit signal which have the first to third greatest amplitudes are merely set to "1", there is the possibility that an identification result which is not a codeword may be outputted.

The correlation detection is superior in the identification performance since this is most likelihood detection of selecting the most likely codeword from among those codewords which may possibly be recorded. However, it is necessary to calculate totaling 256 evaluation values through combination of addition and multiplication, and besides the lowest one of the 256 likelihood values is selected. Therefore, the correlation detection has a problem that a very much complicated circuit configuration is required for the correlation detection.

A computer simulation was conducted wherein the three detection methods described above were applied to a readout signal wherein one page includes 1,632 symbols, and the following results were obtained.

The number of errors detected in 1,632 symbols of one page was 1,316 by the threshold detection, by the sort detection and 118 by the correlation detection (unit: number of symbols which include a bit error).

Meanwhile, the time of the computer calculation was 0.34 seconds by the threshold value detection, 1.08 seconds by the sort detection and 144 seconds by the correction detection.

In this manner, according to the threshold value detection, almost all of the 1,632 symbols include an error and therefore cannot be used at all. The sort detection exhibits a considerably smaller number of detection errors, and also the increase of the calculation time is merely as long as approximately 3 times. On the other hand, the number of detection errors by the correlation detection further reduces from that by the sort detection. However, the calculation time increases to 100 times or more that by the sort detection.

From the results of the simulation, a detection method is desired which achieves both of simplicity and convenience substantially similar to those of the sort detection and a performance substantially similar to that by the correlation detection.

It is to be noted that Non-Patent Document 3 by the same writers as those of Non-Patent Document 2 describes that "the sort detection is likelihood detection". However, where one symbol includes 16 bits, the sort detection falls under one of the following two cases:

(1) a case wherein there is no non-used codeword, that is, wherein all of $_{16}C_3 = 560$ different combinations wherein only three bits from among 16 bits have the value "1" are used as codewords; and (2) another case wherein the 560 different combinations are regarded as binary numbers of 16 bits and numbered as #0 to #559 in the descending order of the magnitude and then 256 ones of the binary numbers which have the order numbers from #0 to #255 in the ascending order are selected as codewords and a special algorithm is used for decoding.

Here, since $2^9 = 512 <_{16}C_3 = 560 < 2^{10} = 1,024$, if it is tried to map k bits of the user to n bits, then this does not fall under the case (1) above. On the other hand, in order for this to fall user the case (2) above, the sparse code of E(16, 3, 8) is decided uniquely. Therefore, such a demand for a recording modulation code that "1 does not successively appear vertically or horizontally within a symbol" as hereinafter described cannot be satisfied.

Therefore, it is demanded to provide a data identification method and apparatus by which both of simplicity and convenience almost same as those by the sort detection and a performance substantially same as that by the correlation detection in an arbitrary sparse code are achieved.

According to an embodiment of the present invention, there is provided a data identification method for identifying, from within a readout signal inputted from a recording medium on which data are recorded using a recording modulation code wherein, from among n bits which form a codeword, m bits have a value of "1" while the remaining n-m bits have another value of "0", the data, n and m being integers, including a first step of delimiting the readout signal in a unit of a codeword, checking the amplitude of each bit of an n-bit codeword obtained by the delimiting and applying numbers from #1 to #n to the bits in a descending order of the amplitude, a second step of setting an n-bit codeword wherein m bits of the order numbers from #1 to #m are set to "1" and the other n-m bits of the order numbers from #(m+1) to #(n-m) are set to "0" as a first candidate for an identification result, a third step of comparing the candidate for an identification result with a table of recording modulation codes to decide whether or not the candidate for an identification result is included in the table of recording modulation codes and outputting, if the candidate for an identification result is included as a recording modulation code in the table of recording modulation codes, the candidate for an identification result as an identification result, and a fourth step of selecting, if the candidate for an identification result is not included in the table of recording modulation codes at the third step, a next candidate for an identification result in an order determined in advance, the third and fourth steps being repeated until an identification result included in the table of recording modulation codes is obtained at the third step.

According to another embodiment of the present invention, there is provided a data identification apparatus which detects information recorded on and read out as a readout signal from a recording medium on which the information is recorded using a recording modulation code wherein, from among n bits which form a codeword, m bits have a value of "1" while the remaining n-m bits have another value of "0" by referring to a table, n and m being integers, including an order number application section configured to delimit the readout signal in a unit of a codeword, check the amplitude of each bit of an n-bit codeword obtained by the delimiting and apply numbers from #1 to #n to the bits in a descending order of the amplitude, a candidate selection section configured to set an n-bit codeword wherein m bits of the order numbers from #1 to #m are set to "1" and the other n-m bits of the order numbers from #(m+1) to #(n-m) are set to "0" as a first candidate for an identification result, a comparison section configured to compare the candidate for an identification result with the table of recording modulation codes to decide whether or not the candidate for an identification result is included in the table of recording modulation codes and output, if the candidate for an identification result is included as a recording modulation code in the table of recording modulation codes, the candidate for an identification result as an identification result, the candidate selection section selecting, if the candidate for an identification result is not included in the table of recording modulation codes, a next candidate for an identification result in an order determined in advance, the selection of a candidate for an identification result, the comparison and the result outputting or the re-selection of a candidate for an identification result being repeated until an identification result included in the table of recording modulation codes is obtained.

In the data identification method and the data identification apparatus, a recording modulation code of data recorded on a recording medium is formed from a plurality of codewords, and from among n bits which form a codeword, m bits have a value of "1" while the remaining n-m bits have another value of "0".

Then, in the data identification method and the data identification apparatus, a readout signal from the recording medium is delimited in a unit of a codeword in accordance with a recoding modulation code system used upon recording. Then, the amplitude of each bit of an n-bit codeword obtained by the delimiting is checked, and order numbers from #1 to #n are applied to the bits in a descending order of the amplitude. Thereafter, an n-bit codeword wherein m bits of the order numbers from #1 to #m are set to "1" and the other n-m bits of the order numbers from #(m+1) to #(n-m) are set to "0" is set as a first candidate for an identification result.

Then, the candidate for an identification result is compared with a table of recording modulation codes in a codeword unit of the recording modulation code. Consequently, it is decided whether or not the candidate for an identification result is included in the table of recording modulation codes. Then, if a result of the detection indicates that the candidate for an identification result is included in the table of recording modulation codes, then the candidate for an identification result is outputted as an identification result.

On the other hand, if the candidate for an identification result is not included in the table of recording modulation codes, a next candidate for an identification result is selected in an order determined in advance. Then, the selection of a candidate for an identification result, the comparison and the result outputting or the re-selection of a candidate for an identification result are repeated until an identification result included in the table of recording modulation codes is obtained.

Here, the order determined in advance is determined, for example, using the sum of the order numbers of the "1" bits as an evaluation value and providing a predetermined priority degree to the evaluation value.

In the data identification, a predetermined number of "1" bits are obtained in the descending order of the bit amplitude. This itself is similar as in the sort detection. However, in the data identification method and the data identification apparatus, referring to the table of recording modulation codes is executed while the candidate for an identification result to which a priority order number is applied is successively changed. Consequently, a wrong identification result which is not included in the table of recording modulation codes is not outputted.

With the data identification method and the data identification apparatus, there is an advantage that data can be identified with simplicity and convenience almost same as those by the sort detection and also with a performance substantially same as that by the correlation detection in an arbitrary sparse code.

The above and other features and advantages of the present invention will become apparent from the following description and the appended claims, taken in conjunction with the accompanying drawings in which like parts or elements denoted by like reference symbols.

BRIEF DESCRIPTION OF THE DRAWINGS

FIGS. 3A, 3B and 3C are views showing the recorded page of FIG. 2 in a more simplified form;

FIGS. 4 to 10 are views illustrating the recorded substance of a table of recording modulation codes;

FIG. 13 is a flow chart illustrating a basic flow of retry detection;

FIGS. 15A, 15B and 15C are a flow chart and tables, respectively, illustrating another particular example of the reply detection;

FIGS. 16A, 16B and 16C are views illustrating results of simulations and an effect of the retry detection.

DETAILED DESCRIPTION OF THE PREFERRED EMBODIMENT

A data identification method to which the present invention is applied is suitable for hologram recording and the like wherein a sparse code is used as a recording modulation code. In a preferred embodiment of the present invention described below, a predetermined number of bits of a unit of a codeword of a recording modulation code of a readout signal are set to "1" in a descending order of the magnitude of the bit amplitude. Then, if an error is included in a result of the sort detection, a next likely candidate is selected, and it is checked whether or not an error is included in the selected candidate. This sequence of operations is repeated. By this, a method which is simple and convenient and implements a good identification performance is provided. The data identification method is referred to as retry detection method because it is an unique method that it involves retrying when an error is included in a candidate for an identification result as hereinafter described.

First, the data identification method to which the present invention is applied and which is applied to a hologram recording and reading system is described.

First, a sparse code (recording modulation code) used in the present embodiment is described.

As described hereinabove, an arbitrary sparse code is defined by E(n, m, k) using a bit number n of bits of one symbol, a bit number m of bits having the value "1" in one symbol, and a bit number k of bits of a user. Here, the "symbol" is a minimum unit of a holographic reproduction image, for example, composed of 4×4 pixels, and one symbol corresponds to one codeword (sparse code).

Figure 17:
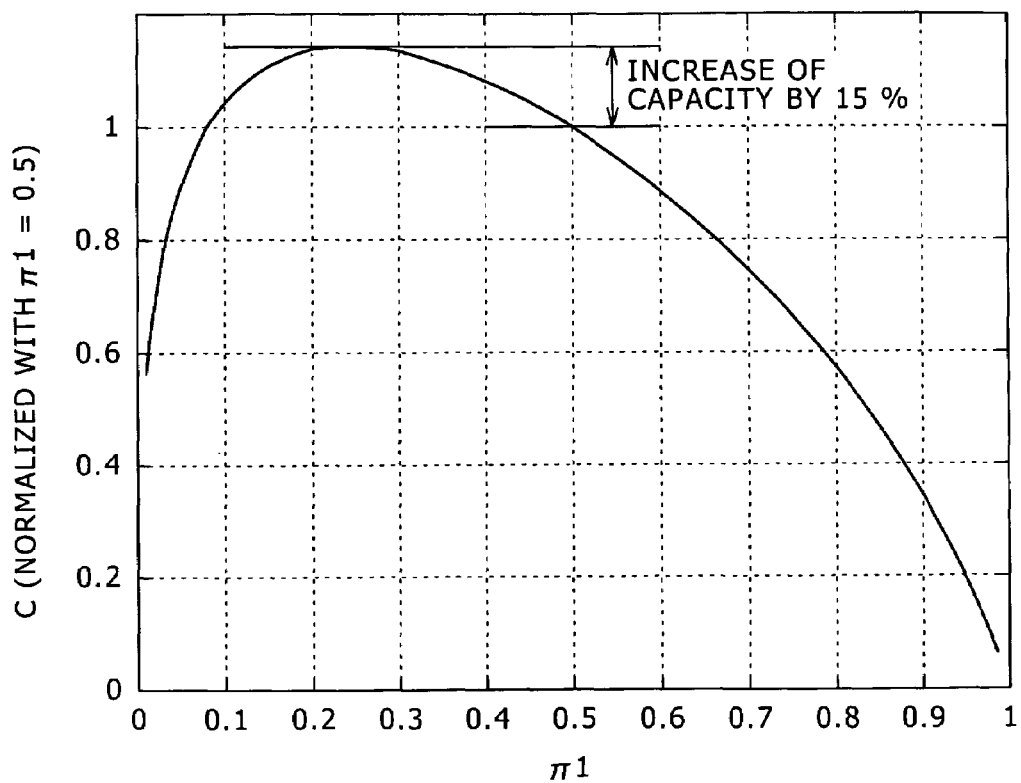
FIG. 17 is a graph illustrating a result of calculation of the user capacity when the sparse ratio is varied from 0 to 1.

As described hereinabove, the recording capacity (user capacity) C of an ideal encoder which can be utilized by the user correlates with a sparse rate n corresponding to the encoding rate of n bits and has a maximum value in the proximity of the sparse rate $\pi1=0.25$ (refer to FIG. 17).

Figure 1:
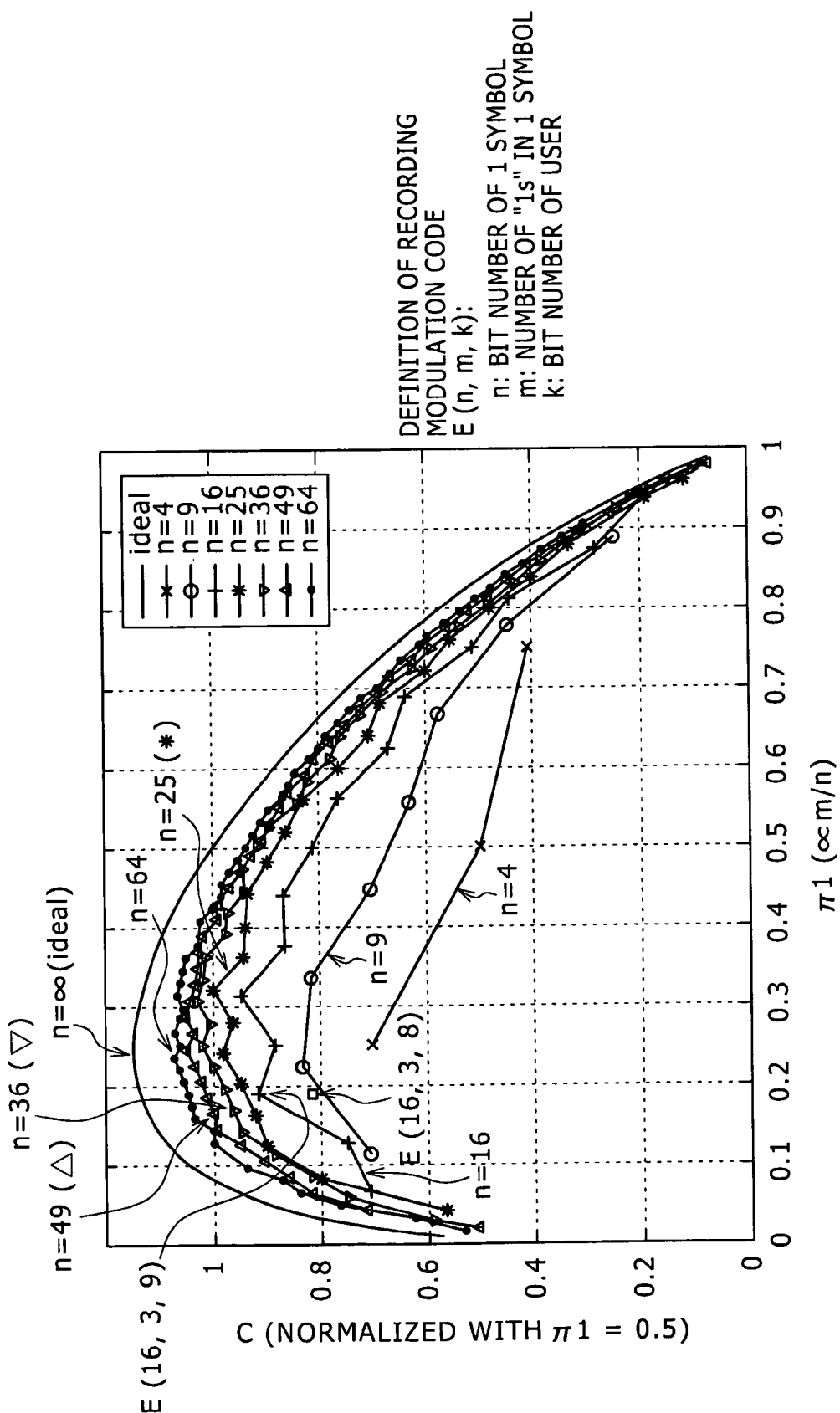
FIG. 1 is a graph illustrating a relationship between the sparse rate and the user capacity when the bit number of the sparse code varies from 4 to 64.

FIG. 1 illustrates the relationship between the sparse rate $\pi1$ and the user capacity C when the bit number n of the sparse code is varied within a range from 4 to 64.

It can be seen from FIG. 1 that, as the bit number n of the sparse code increases, the encoding rate r=k/n increases and an ideal encoder (n=∞) is approached. The encoding rate r is determined from a relationship between a combination $_nC_m$ where m elements are selected from among n elements and $2^k$, and a maximum integer k which satisfies the condition of $2^k <_n C_m$ becomes a bit number of the user. For example, where n=16 and m=3, if the case wherein k=9 and the case wherein k=8 are compared with each other, then since $2^9 > 2^8$ although the number of combinations $_nC_m$ (which increases in proportion to the axis of abscissa of FIG. 1) is equal, it can be seen from FIG. 1 that the user capacity C of E(16, 3, 9) is greater than the user capacity of E(16, 3, 8).

Figure 2:
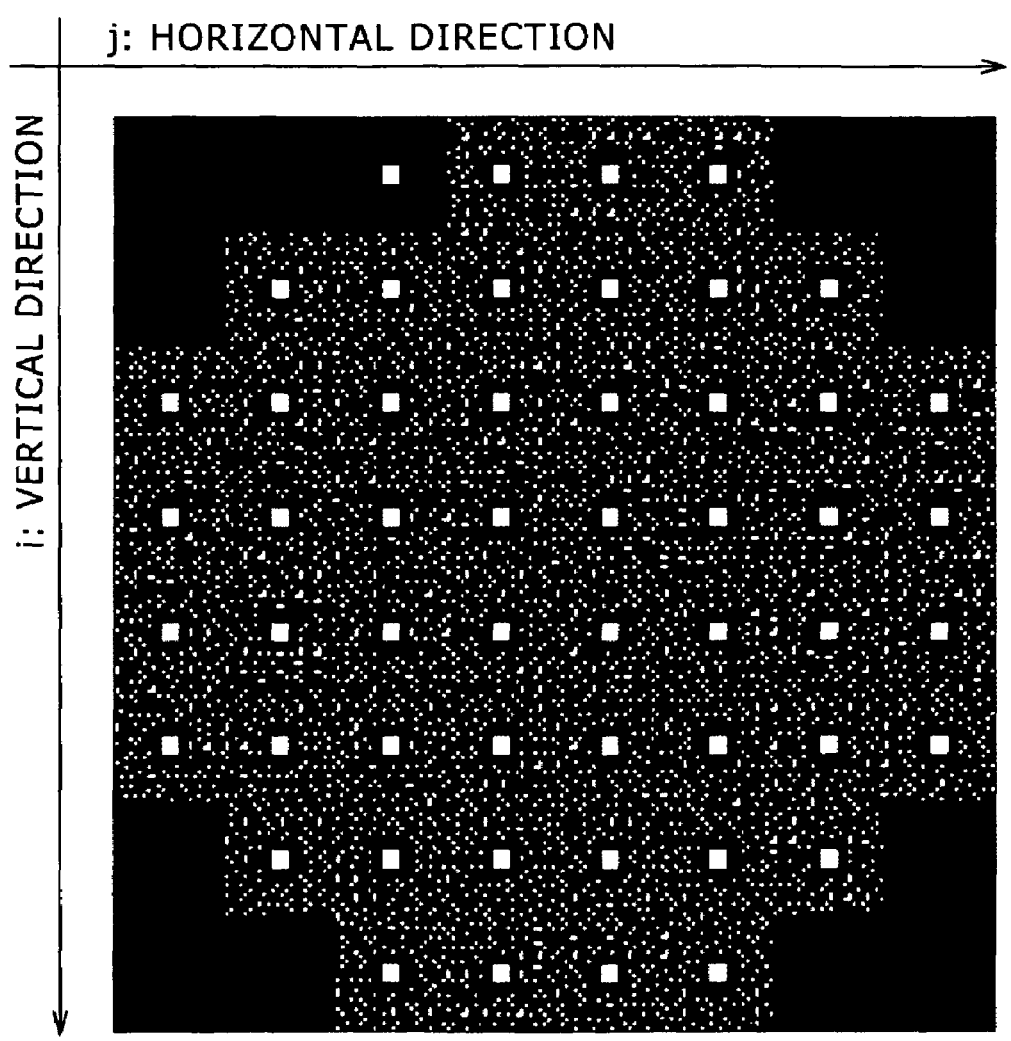
FIG. 2 is a view showing an example of a recorded page by actual hologram recording.

FIG. 2 shows an example of a recorded page actually recorded by hologram recording. FIGS. 3A and 3B show the recorded page of FIG. 2 in a simplified form and FIG. 3C illustrates explanation of the recorded page.

As seen from FIGS. 3A and 3C, the recorded page 1 includes 51 sub pages 11 for data recording and one sub page (page sync.) 12 for synchronization.

Each of the sub pages 11 includes 6×6 symbols 13 as seen in FIG. 3B. A sync (sync.) 14 is formed from four central symbols from among the 36 symbols 13. The sync 14 includes a central region of white corresponding to one symbol and a surrounding region of black.

Each symbol has a configuration of 4×4 bits wherein a "1" data bit represents white and a "0" data bit represents black.

Accordingly, as seen in FIG. 3C, from among the total bit number of 36,864 (=192×192), the number of effective symbols of the recorded page 1 is 1,632.

Here, E(16, 3, 8) is used as the sparse code. If three bits from among 16 bits are set to "1", then the number of combinations where three bits are selected from among 16 bits is $_{16}C_3=560$. Therefore, from $2^9=512<560$, it is possible to set the user bit number to 9 to produce E(16, 3, 9). However, in the present embodiment, only $2^8 256$ symbols are used intentionally. This arises from the following reasons.

First, if a detection method which utilizes the presence of an unused symbol effectively is used, then the number of detection errors can be reduced.

Second, it is desirable to restrict the number of "1s" which appear successively in vertical and horizontal directions to minimize low-frequency components of recorded data. In particular, as hereinafter described above, "1" is not disposed successively in any of the vertical and horizontal directions within a symbol of the sparse code. Further, although two "1s" appear successively between different symbols, three or more "1s" do not appear successively. Although partitioning between different symbols can be performed with a high degree of accuracy with the sync 14, also in this instance, it is desirable to minimize the number of locations at which two "1" bits appear successively.

FIGS. 4 to 10 illustrate the recorded substance of a table for recording modulation codes.

In the table of FIGS. 4 to 10, 256 different symbols adopted by the sparse code E(16, 3, 8) are collected. The symbols have been determined through a search for those symbols which satisfy the conditions that only 3 bits from among 16 bits have the value "1" and besides that "1" does not appear successively in any of the vertical and horizontal direction within each symbol. Although actually 276 different symbols which satisfy the conditions described have been found, 256 ones from among the 276 symbols are selectively used each of which indicates a comparatively low value where it is converted into a 16-bit binary number such that the left upper bit is determined as the least significant bit LSB while the right lower bit is determined as the most significant bit MSB.

Figure 11:
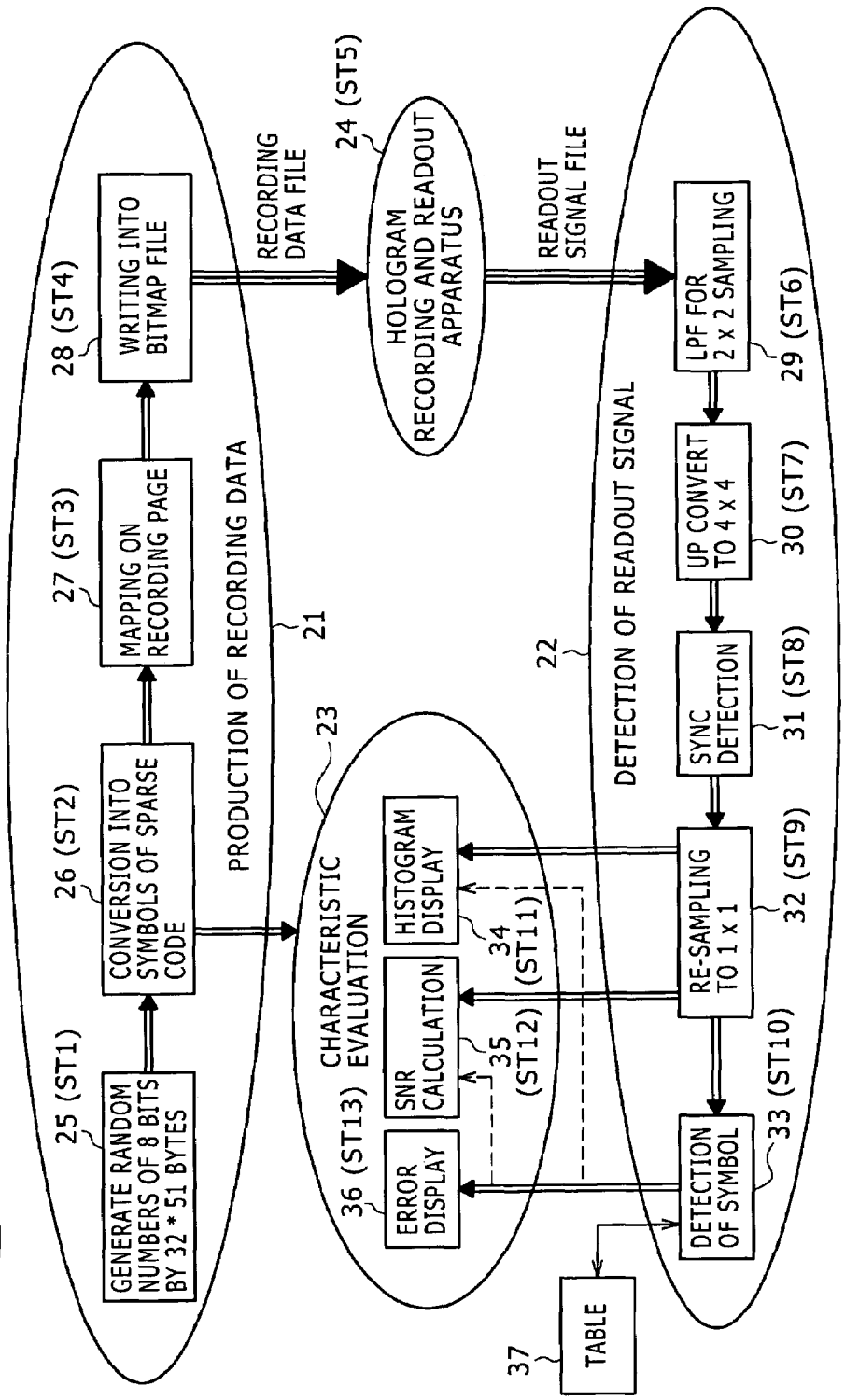
FIG. 11 is a block diagram showing a system configuration of a hologram recording and reproduction apparatus to which the present invention is applied.

FIG. 11 shows a system configuration of a hologram recording and reproduction apparatus. It is to be noted that FIG. 11 illustrates also a processing flow, and a processing procedure is indicated by arrow marks. The substance of a process is illustrated in each elongated circle.

Referring to FIG. 11, the hologram recording and reproduction apparatus 20 shown includes a recording data production block 21, a readout signal detection block (recorded data reproduction) 22, a characteristic evaluation block 23 and a hologram recording and readout apparatus 24. The blocks mentioned may be formed as individual apparatus separate from each other, or, for example, the blocks other than the hologram recording and readout apparatus 24 may be formed from a single processing apparatus.

The recording data production block 21 includes a random number generation section 25 (random number generation step ST1), a code conversion section 26 (code conversion step ST2), a mapping section 27 (mapping step ST3) and a file writing section 28 (file writing step ST4).

Though not shown, the hologram recording and readout apparatus 24 includes various sections including a DMD (Digital Micromirror Device) as a recording SLM (Spatial Light Modulator), a CMOS (Complementary Metal Oxide Semiconductor) sensor as an image pickup device for detecting readout light, and a hologram recording medium. The hologram recording and readout apparatus 24 further includes a light source for signal light (physical light) modulated by the DMD and an illuminating light source for the signal light, and optical systems for reference light and illumination light which are irradiated together with a signal on the hologram recording medium upon recording. The hologram recording and readout apparatus 24 further includes a readout optical system for forming, upon reading out, an image of readout light on an image pickup plane of the CMOS sensor, a data conversion section, and a control section for the components mentioned of the hologram recording and readout apparatus 24. The hologram recording and readout apparatus 24 uses the components such that light from the light source is optically modulated by the predetermined DMD with a signal of a recorded data file from the file writing section 28 (file writing step ST4) and irradiates the modulated light on the recording medium together with the reference light to record a hologram on the recording medium. Then, reference light of the same conditions as those upon recording is irradiated upon the recording medium to read out the recorded data and outputted as a readout signal (file).

The step at which the series of processes described is executed is referred to as hologram recording and readout processing step ST5.

The readout signal detection block 22 includes a low-pass filter (LPF) section 29 (LPF processing step ST6), an up converter 30 (up conversion step ST7), a sync detection section 31 (sync detection step ST8), a re-sampling section 32 (re-sampling step ST9) and a symbol detection section 33 (symbol detection step ST10).

The symbol detection section 33 (symbol detection step ST10) principally executes the data identification method to which the present invention is applied. It is to be noted that a control section (CPU or the like) for the entire hologram recording and reproduction apparatus may execute part of the data identification method to which the present invention is applied.

The characteristic evaluation block 23 includes a histogram display section 34 (histogram display step ST11) which produces a histogram for data display from a signal from the re-sampling section 32 (re-sampling step ST9) or a signal after symbol detection. The characteristic evaluation block 23 further includes an SNR calculation step section 35 (SNR calculation step ST12) which calculates a signal to noise ratio (SNR) from a signal from the re-sampling section 32 (re-sampling step ST9) or a signal after symbol detection, and an error display section 36 (error display step ST13) which performs error display.

Now, operation of the hologram recording and reproduction apparatus 20 having the configuration described above is described.

The recording data production block 21 generates 8-bit random numbers by 32×51=1,632 bytes (13,056 bits) equal to the user data number k for one page. In the present example, since one symbol represents data of 8 bits (1 byte) and the number of effective symbols in one page is 1,632 as seen from FIGS. 3 and 4 to 10, a number of random numbers equal to the number of symbols are generated.

The 8-bit data generated as random numbers are sent to the code conversion section 26 (code conversion step ST2), by which they are converted into symbols of the sparse code wherein only 3 bits from among 16 bits are "1" and the remaining bits are "0". It is to be noted that, where recording data are to be produced from content data of predetermined sound, image, document or the like, the random number generation section 25 (random number generation step ST1) is omitted, and an amount of sparse codes corresponding to the magnitude of the content data is produced by the code conversion section 26 (code conversion step ST2).

Then, the mapping section 27 (mapping step ST3) combines the symbols of the sparse code and the sync 14 and page sync 12 (refer to FIG. 3) to produce recording pages.

Finally, the file writing section 28 (file writing step ST4) converts the recording pages into data of a file format, for example, into a bitmap file which can be read by an experimental apparatus for hologram recording.

The bitmap file produced by the recording data production block 21 is sent to the hologram recording and readout apparatus 24, by which hologram recording and reading out are executed.

First, an image wherein each pixel of the DMD (Digital Micromirror Device) used as an SLM (Spatial Light Modulator) for recording is set to on or off in response to the data of "1" or "0" of the bitmap is irradiated on the hologram recording medium. At this time, multiplexed-recording may be performed in accordance with conditions of the light reference position of the medium and reference light at this time.

Upon reading out, reference light is irradiated upon the hologram recording medium at the position and in the conditions same as those upon recording. At this time, light (readout light) from the medium is focused on the image plane of the CMOS sensor by a predetermined optical system. Further, the position of the CMOS sensor is adjusted as precisely as possible to perform reading out. The magnification of the CMOS sensor (or readout light) is adjusted together with the position of the CMOS sensor (or readout light) so that light from one pixel of the DMD may be irradiated upon the light receiving section of the 2×2=4 CMOS sensors. It is to be noted that, while various methods are available for hologram recording and readout, any method may be used here.

An image signal is outputted from the CMOS sensor and is converted into and outputted as a readout signal file to the readout signal detection block 22.

In the readout signal detection block 22, the low-pass filter (LPF) section 29 (LPF processing step ST6) first passes the readout signal after oversampled to 2×2 through a simple two-dimensional LPF to limit the bandwidth. Although any method may be used for the oversampling, a method of merely averaging sensor outputs of four sensors is used.

Then, in order to raise the accuracy of re-sampling, the up converter 30 (up conversion step ST7) up converts to 4×4.

Then, the sync detection section 31 (sync detection step ST8) detects the page sync and sub page sync in order. In particular, the sync detection section 31 detects the page sync 12 illustrated in FIG. 3A thereby to detect the top of a page. Thereafter, every time a signal part which corresponds to a white square (sync 14) of 4×4 bits which appears periodically is detected, the sync detection section 31 delimits the sub pages 11 converted with reference to the sync 14 and then symbols 13 of 4×4 bits which form the sub pages 11. Therefore, the next re-sampling section 32 (re-sampling step ST9) and the symbol detection section 33 (symbol detection step ST10) are executed in synchronism so that the delimiting may not be displaced.

The re-sampling section 32 (re-sampling step ST9) performs re-sampling so that each data may correspond in a one-by-one (1×1) corresponding relationship with a pixel of the SLM (DMD) in the hologram recording and readout apparatus 24 to decompose the data in a unit of a symbol 13. Then, the next symbol detection section 33 (symbol detection step ST10) executes, for example, "a detection method wherein those 3 bits which exhibit a comparatively great amplitude from among 16 bits are set to "1" and the likelihood increases", that is, retry detection to which the present invention is applied. Details of the data detection are hereinafter described.

A table 37 for use for the retry detection is provided in the symbol detection section 33. The table 37 stores combination data of the determined sparse codes of FIGS. 4 to 10. Further, the code conversion section 26 (code conversion step ST2) may re-write the table 37 in response to a result of the conversion of the sparse code of the code conversion section 26 (code conversion step ST2).

The recorded data (detection signal data) restored by the retry detection are sent to the characteristic evaluation block 23, by which a predetermined evaluation process is performed for the recorded data.

Although any evaluation process may be used, histogram display, SNR calculation and error display are described as examples.

The error display section 36 (error display step ST13) maps bits and symbols 13 (FIG. 3) at which an error is detected on the page and displays the positions at which the error is detected.

Further, the SNR calculation step ST12 (SNR calculation step ST12) calculates an average value and a variance of "1s" and "0s" over the overall page to determine a signal to noise ratio (SNR). Further, the SNR calculation step ST12 (SNR calculation step ST12) calculate an amplitude distribution of "1" data and an amplitude distribution of "0" data and displays a histogram.

Figure 12B:
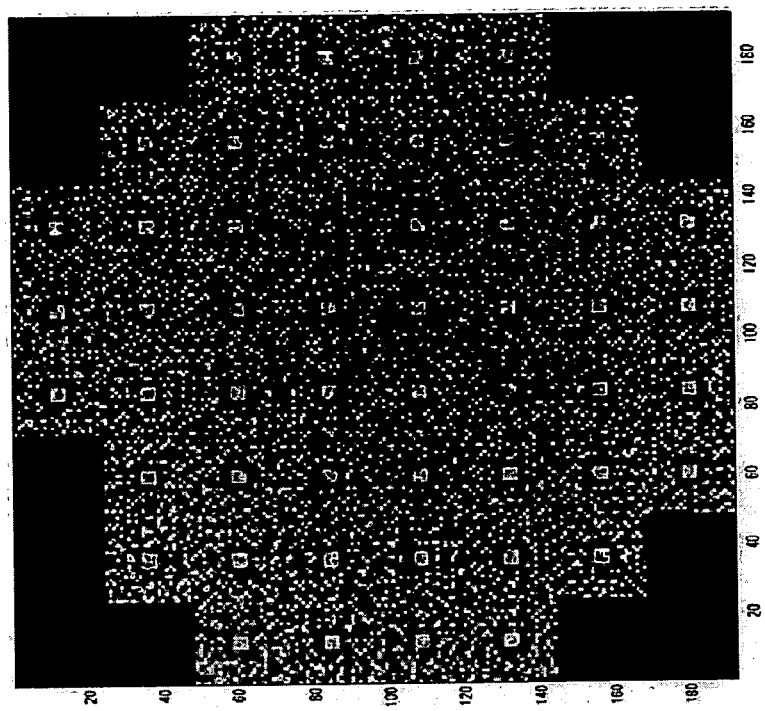
FIGS. 12A and 12B are map diagrams of a readout signal from a recorded hologram.
Figure 12A:
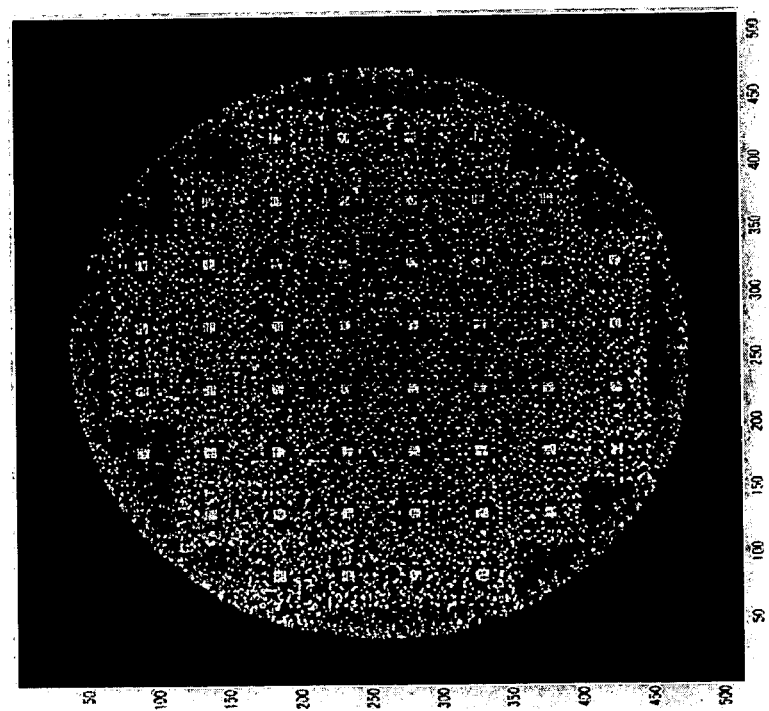

FIGS. 12A and 12B illustrate an example of a readout signal of recorded holograms.

FIG. 12A shows a bitmap of a readout signal where 2×2=4 sensor light receiving sections are allocated to recorded data of 1 bit so that the data of 1 bit is oversampled to 2×2. A result where the process described above is performed for the oversampled signal to re-sample the same to 1×1 is illustrated in FIG. 12B. Here, peripheral unnecessary noise parts are removed so as to leave only those portions corresponding to those illustrated in FIG. 3A.

It is to be noted that, although the pixel number of the DMD is 1,240 wide (W)×726 high (H), only 256 (W)×256 (H) pixels are actually used including reference light. Further, if it is assumed that one recorded page corresponds to 192×192=36,864 bits without taking reference light and so forth into consideration, then the user data number k is the effective symbol number 1,632×8 bits=13,056 bits. Accordingly, the encoding ratio is 13,056/36,864=0.354.

FIG. 13 illustrates a flow chart of the retry detection. More particularly, FIG. 13 illustrates a basic procedure of the retry detection. This process is executed after a readout signal is delimited into codeword units.

Referring to FIG. 13, first at step ST20, the amplitude of individual bits of one of n-bit (in the present example, n=16) codewords which form the readout signal, and the bits are numbered as #1 to #n in the descending order of the amplitude.

At step ST21, the bits of the order numbers #1 to #m are set to "1" and the bits of the order numbers #(m+1) to #n are set to "0", and a result of the setting is determined as a first candidate for an identification result.

Then at step ST22, the recorded contents of the table 37 (FIG. 11) of recording modulation codes and the candidate for an identification result are compared with each other to investigate whether or not the candidate for an identification result is included in the table 37 of recording modulation codes (FIG. 11).

If the candidate for an identification result is included as a recording modulation code in the table 37, then this is outputted as an identification result (step ST23).

On the other hand, if the candidate for an identification result is not included as a recording modulation code in the table 37 at step ST22, then a next candidate for an identification result is selected in the order determined advance (step ST24). Then, the decision at step ST22 is performed now for the newly selected candidate for an identification result.

The processes at steps ST22 and ST24 are repeated until after a decision of "YES" is obtained at step ST22. Although, in the repetition loop process just described, the candidate for an identification result is successively changed, no overlapping decision is performed with regard to the same candidate.

After the process at step ST23, the processing returns at step ST0. Then, if a next n-bit codeword is inputted, then the processes at steps ST20 to ST23 are repeated, but if no n-bit codeword is inputted any more, then the processing is ended immediately.

It is preferable to apply some restriction to the candidate selection described above. This is because, if a limited number of times is reached, then the candidate for an identification result decided latest is to be outputted as an identification result.

Figure 14:
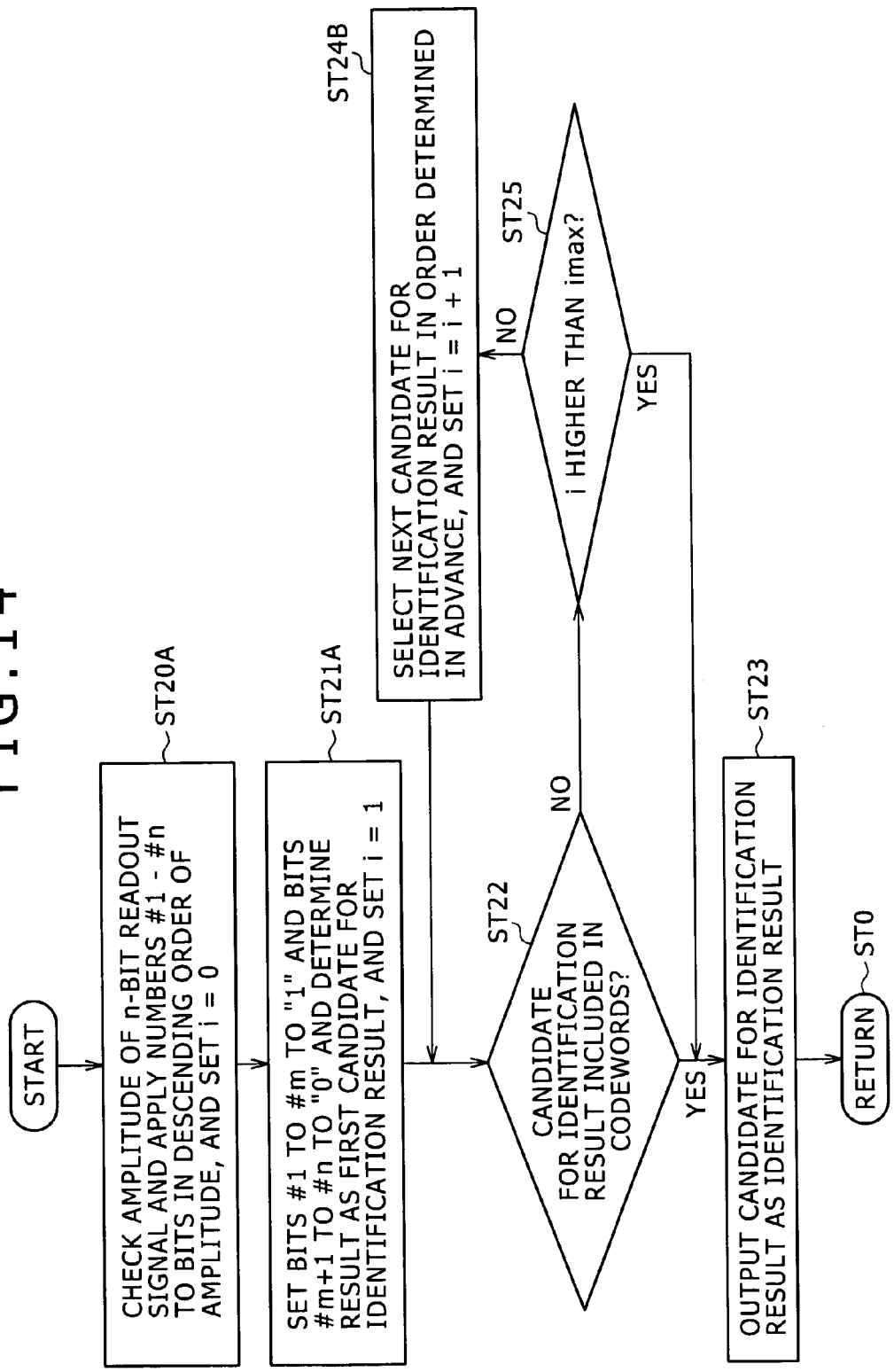
FIG. 14 is a flow chart illustrating a particular example of the retry detection.

FIG. 14 illustrates a flow chart in this instance.

The procedure of FIG. 14 is different from that of FIG. 13 in that a parameter "i" for counting the number of times of selection of a candidate is provided and the try number i is initialized to i=0 at step ST20A of FIG. 14 which corresponds to step ST20 of FIG. 13. Further, at step ST21A of FIG. 14 which corresponds to step ST21 (FIG. 13), since the selection in this instance is selection of a first candidate, the try number i is set to i=1. Further, a step ST25 is provided so that, if a decision of "No" is made at step ST22, then the try number i is compared with a predetermined limit number imax. If a result of the comparison indicates that the try number i is equal to or lower than the limit number imax, then the processing advances to step ST24A, but if the try number i is higher than the limit number imax, then the processing skips to step ST23. At step ST24A, a candidate for an identification result is selected in an order determined in advance, and the try number i is incremented (i=i+1). Then, the process at step ST22 is executed again.

In the processing flow shown in FIG. 14, another route for quitting the loop process by the steps ST23 and ST24A is provided. When this route is taken, the candidate for an identification result used in the latest comparison is outputted as it is, and thereafter the processing returns (steps ST23 and ST0).

FIGS. 15A to 15C illustrate two different more particular candidate selection methods. FIG. 15A is a flow chart for reference, which is basically same as that of FIG. 14. FIG. 15B illustrates a first method (particular selection procedure) while FIG. 15C illustrates a second method (particular selection procedure). In the particular examples, a sparse code E(16, 3, 8) is used.

The procedure of FIG. 15A is different from that of FIG. 14 in that the bit number n of the sparse code is n=16 and the "1" bit number m is m=3 and that, at step ST24B which replaces the step ST24A of FIG. 14, the predetermined order is provided in such a manner as seen in the table of FIG. 15B or 15C. Further, the limit number imax at step S25 is defined as "11". The value of the limit number imax may be any number and is not restricted to the example described.

The first method in which the order defined in FIG. 15B is described first.

While the process of FIG. 15A is executed similarly as in the process of FIG. 14, referring regarding a first candidate for an identification result is executed at step ST22. In the present referring, since the try number i is i=1, it is checked whether or not the table 37 includes a pattern in which the "1" bits of the three order numbers #1, #2 and #3 beginning with the highest order number are included with regard to the candidate for a detection result as seen in FIG. 15B. In this instance, the sum M of the order numbers is M=6.

If the pattern is not included in the table 37, then it is examined at step ST25 whether or not the try number i is higher than 11.

Since the try number i currently is lower than 11, the try number i is incremented first (i=2), and a candidate for a selection result is selected again in accordance with the order of FIG. 15B. At this time, since any other combination wherein the sum M of the order numbers is M=6 is not included in the table of FIG. 15B (the order numbers do not overlap with each other), a number is selected in accordance with a condition of M+1=7. In this instance, only a combination of the order numbers #1, #2 and #4 exists, and it is examined whether or not the table 37 includes a pattern in which the "1" bits of the combination are included.

A loop process wherein the processes at steps ST22, ST25 and ST24B are repeated is executed in s similar manner.

If a decision of "Yes" is obtained at step ST22 or the try number i exceeds 11 at step ST25 while the loop process is executed repetitively, then the loop process is quitted.

A case wherein the try number i reaches the limit number is examined. Where a candidate wherein the sum M of the order numbers is M=8 is selected subsequently as seen in FIG. 15B, two different combinations of the order numbers #1, #2 and #5 and the order numbers of #1, #3 and #4 are available. In this instance, a criterion that "a combination which includes a comparatively great number of bits having a comparatively low order number bit takes precedence" is applied. Accordingly, the former combination of the numbers #1, #2 and #5 is selected first.

Thereafter, also where the sum M of the order numbers is M=9 and where the sum M of the order numbers is M=10, a similar reference is applied for the selection. Then, it is decided whether or not the table 37 includes a pattern which has the "1" bits at the positions provided by the combination of the order numbers.

After the loop process is quitted, the result of the referring or the candidate at the latest referring is outputted as an identification result in a similar manner as in the case of FIG. 14. Thereafter, the process returns or ends.

Also the second method in which the order of FIG. 15C is used is similar in the flow of processing to that of FIG. 15B.

Here, the reference in selection with regard to the "1" bit number m of the same number is different. In particular, that "a combination which includes a comparatively great order number of a bit which has the lowest order number takes precedence" is applied as a reference. For example, where the sum M of the order numbers is M=9, while, according to the first method, the numbers #1, #2 and #6 are selected preferentially, according to the second method, the numbers #2, #3 and #4 wherein the lowest order number is #2 which is comparatively high are selected.

Order numbers are selected in accordance with a similar reference also where the sum M of the order numbers is M=10, and it is decided whether or not the table 37 includes a pattern which has the "1" bits at the same positions as those of the combinations of the order numbers.

After the loop process is quitted, the result of the referring or the candidate at the latest referring is outputted as an identification result in a similar manner as in the case of FIG. 14. Thereafter, the process returns or ends.

It is to be noted that, although details are omitted, where two or more combinations wherein the sum of order numbers representative of the magnitude of the amplitude is equal are available, the following method may be adopted. In particular, the combination which exhibits a comparatively high sum of the amplitudes of the m bits which are to exhibit "1" is selected preferentially as a next candidate for an identification result.

FIGS. 16A, 16B and 16C illustrate effects of the present embodiment in comparison with the threshold value detection, sort detection and correlation detection. In FIGS. 16A and 16B, the axis of abscissa indicates different detection methods, and the axis of ordinate of FIG. 16A indicates the number of errors in 1,632 symbols and the axis of ordinate of FIG. 16B indicates the processing time. FIG. 16C illustrates original data of FIGS. 16A and 16B in the form of a table.

The OS of the computer used was "Windows XP Pro (trademark)"; the CPU used for the process of the symbol detection section 33 (symbol detection step ST10) was "Celeron (trademark) 2 GHz"; and a RAM of 768 MB was used as the table 37. Further, the simulation program used was produced on "Matlab Version 7.0 (R14)(trademark)".

In FIGS. 16A to 16C, the "retry detection" corresponds to the present invention. In FIGS. 16A and 16B, the axis of abscissa x=2 of the graphs corresponds to imax=1, x=3 to imax=3, x=4 to imax=6, and x=5 to imax 11.

It can be seen that, as the retrying number increases beginning with that of the sort detection where imax is "0", the number of errors decreases. Since all identification results are included in codewords when the limit number imax is imax=11, even if the value of the limit number imax is increased, the number of errors cannot be reduced any more. Where the limit number imax is set to imax=11 (x=5), the error number is 119. Consequently, the retry detection exhibits a performance which is much higher than that of the sort detection and is substantially same as that of the correlation detection.

On the other hand, the calculation time exhibits little difference. Since not a computer for exclusive use but a general purpose personal computer (PC) was used for the simulations, it seems that there exists a number of times of retrying at which the calculation time is minimized. However, this signifies that only a difference corresponding to the range of dispersion appears. When an actual circuit is to be designed, if the number of times of retrying is increased, also the circuit scale increases as much. However, it is apparent that, if this is compared with that according to the correlation detection whose calculation time is longer than 100 times or more, then the circuit can be implemented with a much smaller scale.

From the foregoing, it is apparent that a data identification method which achieves both of simplicity and convenience substantially similar to those of the sort detection and a performance substantially similar to that by the correlation detection can be implemented by applying the present invention.

It is to be noted that, although the present invention is directed to an information processing apparatus to which hologram recording is applied, since the essence thereof resides in a data identification method, the present invention not only allows application to detection of hologram recorded data but also allows wide varieties of application.

While a preferred embodiment of the present invention has been described using specific terms, such description is for illustrative purposes only, and it is to be understood that

What is claimed is:

1. A data identification method for identifying, from within a readout signal inputted from a recording medium on which data are recorded using a recording modulation code wherein, from among n bits which form a codeword, m bits have a value of "1" while the remaining n-m bits have another value of "0", the data, n and m being integers, comprising:
   a first step of delimiting the readout signal in a unit of a codeword, checking the amplitude of each bit of an n-bit codeword obtained by the delimiting and applying numbers from #1 to #n to the bits in a descending order of the amplitude;
   a second step of setting an n-bit codeword wherein m bits of the order numbers from #1 to #m are set to "1" and the other n-m bits of the order numbers from #(m+1) to #(n-m) are set to "0" as a first candidate for an identification result;
   a third step of comparing the candidate for an identification result with a table of recording modulation codes to decide whether or not the candidate for an identification result is included in the table of recording modulation codes and outputting, if the candidate for an identification result is included as a recording modulation code in the table of recording modulation codes, the candidate for an identification result as an identification result; and
   a fourth step of selecting, if the candidate for an identification result is not included in the table of recording modulation codes at the third step, a next candidate for an identification result in an order determined in advance;
   the third and fourth steps being repeated until an identification result included in the table of recording modulation codes is obtained at the third step.

2. The data identification method according to claim 1, wherein, at the third step, the sum of the order numbers each representative of the magnitude of the bit amplitude is used as an evaluation value of likelihood and the next candidate for an identification result is determined in the ascending order of the evaluation value from among the n-bit codewords in such a manner that, where the sum of the order numbers from 1 to m is represented by M, a candidate for an identification result wherein the sum of the order numbers is M+1 is selected, and when all of combinations wherein the sum of the order numbers is M+1 are selected, a candidate for an identification result wherein the sum of the order numbers is M+2 is selected.

3. The data identification method according to claim 2, wherein, where the order numbers of two or more combinations each representative of the amplitude exhibit an equal value, that one of the combinations which includes a comparatively great number of bits which have comparatively small order numbers takes precedence in selection of the next candidate for an identification result.

4. The data identification method according to claim 2, wherein, where the order numbers of two or more combinations each representative of the amplitude exhibit an equal value, that one of the combinations which includes a comparatively great order number of a bit which has the lowest order number takes precedence in selection of the next candidate for an identification result.

5. The data identification method according to claim 2, wherein, where the order numbers of two or more combinations each representative of the amplitude exhibit an equal value, that one of the combinations which exhibits a comparatively great sum of the amplitudes of the m bits which have the value of "1" takes precedence in selection of the next candidate for an identification result.

6. The data identification method according to claim 2, wherein, where the order numbers of two or more combinations each representative of the amplitude exhibit an equal value, that one of the combinations which exhibits a comparatively small number of bit errors after an identification result is finally determined.

7. The data identification method according to claim 1, wherein the number of times by which the next candidate for an identification result is selected and it is decided whether or not the selected candidate for an identification result is included in the table of recording modulation codes is limited to a predetermined time number, and if an identification result which is included in the recording modulation codes is not obtained, then the last candidate is outputted as an identification result.

8. The data identification method according to claim 1, wherein an n-bit codeword of the identification object is successively changed to repeat the first to third steps or the third and fourth steps until an identification result included in the table of recording modulation codes is obtained at the third step.

9. The data identification method according to claim 1, wherein the data are recorded on the recording medium by hologram recording.

10. A data identification apparatus which detects information recorded on and read out as a readout signal from a recording medium on which the information is recorded using a recording modulation code wherein, from among n bits which form a codeword, m bits have a value of "1" while the remaining n-m bits have another value of "0" by referring to a table, n and m being integers, comprising:
   an order number application section configured to delimit the readout signal in a unit of a codeword, check the amplitude of each bit of an n-bit codeword obtained by the delimiting and apply numbers from #1 to #n to the bits in a descending order of the amplitude;
   a candidate selection section configured to set an n-bit codeword wherein m bits of the order numbers from #1 to #m are set to "1" and the other n-m bits of the order numbers from #(m+1) to #(n-m) are set to "0" as a first candidate for an identification result;
   a comparison section configured to compare the candidate for an identification result with the table of recording modulation codes to decide whether or not the candidate for an identification result is included in the table of recording modulation codes and output, if the candidate for an identification result is included as a recording modulation code in the table of recording modulation codes, the candidate for an identification result as an identification result;
   said candidate selection section selecting, if the candidate for an identification result is not included in the table of recording modulation codes, a next candidate for an identification result in an order determined in advance;
   the selection of a candidate for an identification result, the comparison and the result outputting or the re-selection of a candidate for an identification result being repeated until an identification result included in the table of recording modulation codes is obtained.

* * * * *